United States Patent [19]

Casciotti et al.

[11] Patent Number: 5,037,312
[45] Date of Patent: Aug. 6, 1991

[54] CONDUCTIVE GEL AREA ARRAY CONNECTOR

[75] Inventors: Albert Casciotti, Hershey, Pa.; Frederick R. Deak, Kernersville; John R. Rowlette, Clemmons, both of N.C.

[73] Assignee: AMP Incorporated, Harrisburg, Pa.

[21] Appl. No.: 613,195

[22] Filed: Nov. 15, 1990

[51] Int. Cl.⁵ .................. H01R 9/09; H01R 23/68
[52] U.S. Cl. ............................. 439/66; 439/91; 439/178; 439/591
[58] Field of Search ............ 439/66, 86, 90, 91, 439/178, 179, 591

[56] References Cited

U.S. PATENT DOCUMENTS

| | | | |
|---|---|---|---|
| 4,008,300 | 2/1977 | Penn | 439/91 |
| 4,770,641 | 9/1988 | Rowlette | 439/86 |
| 4,814,040 | 3/1989 | Ozawa | 439/91 |
| 4,891,013 | 1/1990 | Komaki | 439/66 |

FOREIGN PATENT DOCUMENTS 2531217 1/1977 Fed. Rep. of Germany ...... 439/178

Primary Examiner—Paula A. Bradley
Attorney, Agent, or Firm—Allan B. Osborne

[57] ABSTRACT

An electrical connector (30) includes a body (34) of elastomeric material having cavities (38) containing a conductive gel operable upon deformation of the body of said connector to interconnect conductive pads (16, 22) between components such as a printed circuit board (12) and a chip carrier (20).

13 Claims, 3 Drawing Sheets

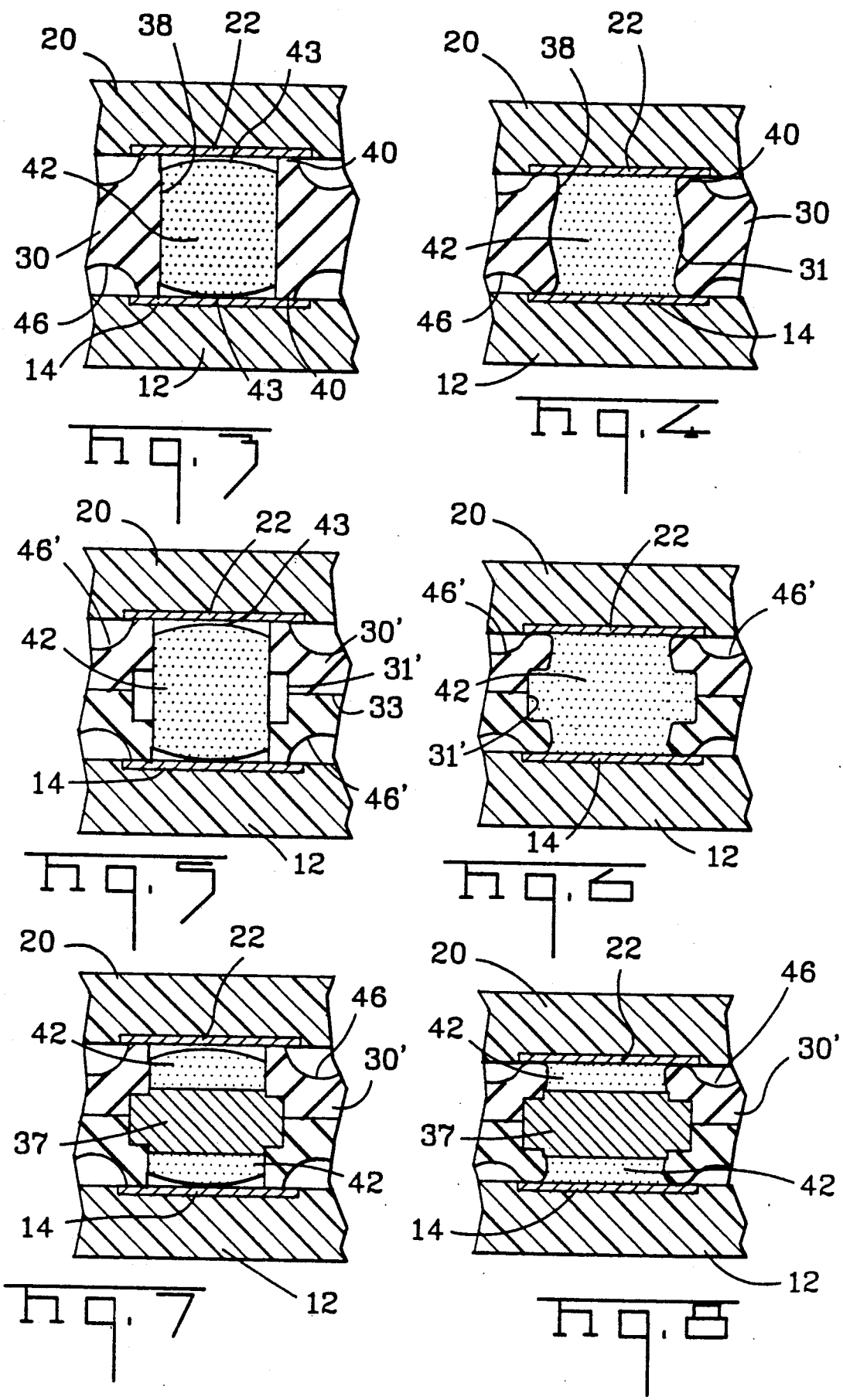

CONDUCTIVE GEL AREA ARRAY CONNECTOR

This invention relates to an electrical connector for interconnecting multiple conductive paths in an area array which employs a conductive gel held in an elastomeric material body.

BACKGROUND OF THE INVENTION

U.S. Pat. No. 4,770,641 granted Sept. 13, 1988 deals with a conductive gel interconnection apparatus which is used to establish electrical interconnection between a plurality of associated conductors such as wires, conductive traces on printed circuit boards, pin grid arrays or other components where there are closely spaced conductors positioned in an array on a substrate. The apparatus uses an insulative body having one or more open-ended cavities containing a conductive gel which is brought into contact with two discrete electrical elements to provide an interconnection therebetween. The patent deals with a disconnectable type of connector and with a particular type of gel which, while conforming to the housing cavities in which it is used, is sufficiently coherent and viscous that it will not flow from the cavity, and upon disconnection of the elements will return to its original shape and remain within the housing cavities.

The advantage of the foregoing mentioned patent in one major respect is that the so-called contact forces of engagement, or forces of withdrawal from the gel, are minimal as compared with traditional connectors. Specifically, traditional electrical connectors require normal forces of interconnection in the range between 50 grams for gold plated contacts to over 200 grams for tin plated contacts, as bare minimums for connectors which experience modest environments. Conductive gel contacts involve normal forces of a few grams for the gel connect and disconnect functions.

The present invention has as an object an improvement over the foregoing mentioned patent with respect to the provision of conductive gel interconnections. A further object is to provide an area array connector which can be connected and disconnected with minimum forces of engagement to allow high numbers of contact points such as experienced in pin grid arrays to be interconnected and disconnected repeatedly. A still further object is to provide an inexpensive, area array, interposer type interconnection system for packaging electrical and electronic components such as integrated circuits. A still further object is to provide a high compliance, low-force and environmentally sealed connector in an inexpensive package.

SUMMARY OF THE INVENTION

The present invention meets the foregoing objectives by providing a connector body of elastomeric material having one or more cavities therein containing a conductive gel. The connector body is given a geometry relative to the cavity in the gel such that it can be deformed by a compression between two conductive pads to diminish the volume of the cavity causing the gel to come in intimate contact with the pads. Projecting lips formed of the elastomeric material of the body of the connector project around a cavity so as to be readily deformable to seal the interconnection between gel and conductive pad environmentally and limit the flow of gel under the force of pressure when used to effect an interconnection. The invention contemplates a connector body formed of an elastomeric material with arrays of cavities, each containing gel and each containing the aforementioned geometry to interconnect contacts paths between an integrated circuit component such as an area of grid array and a printed circuit board forming part of a complex electronic circuit. Embodiments are presented wherein cavity shapes are readily deformable to compensate for gel flow and pressure to readily accommodate closure tolerances. Other embodiments are included which show cavities relieved to accommodate gel flow and an embodiment is included which includes a conductive mass within a cavity which operates to reduce the overall bulk resistance of the displaced gel material.

IN THE DRAWINGS

FIG. 3 is a section taken along lines 3—3 of the connector shown in FIG. 2 in a condition of initial closure of components.

FIG. 4 is a section of the element shown in FIG. 3 as compressed to provide an interconnection.

FIG. 5 is a section of an alternative embodiment of the invention in an unactivated condition.

FIG. 6 is a sectional view of the elements of FIG. 5 following activation and compression.

FIG. 7 is a further alternative of the invention shown in section prior to activation.

FIG. 8 is a view of the elements shown in section in FIG. 7 following activation.

DETAILED DESCRIPTION OF THE INVENTION

In the description hereinafter given, reference will be made to a conductive gel and to elastomeric materials. The characteristics of these materials are important to the functionality of the invention and while broad variations in the characteristics are important. The conductive gel referred to is one that will have a memory-like viscosity such that it will accept numerous intermating geometric forms and will conform to the surface area of conductors to be intermated. The gel should flow under pressure but return to its original shape when the pressure is removed. The conductive gel should not stick to conductive pads or other conductors when driven to flow against and interconnect with such. And, of course, a conductive gel must be conductive. In a preferred embodiment, a gel known under the trademark SYLGARD 527, manufactured by Dow Corning Corporation, which is a two-part system, was mixed in a one-to-one ratio and cured to form a cushioning, self-healing and resilient gel-like mass. The gel was made conductive by a fill of conductive particles distributed therein and conductive particles included silver coated nickel particles and/or silver coated glass particles and in certain cases, solid silver spheres or silver flakes. A fill of particles on the order of between 20 and 40 percent by volume of particles to volume of dielectric material operates to provide a conductivity threshold on the order of 20 to 30 percent by volume in the dielectric medium.

The elastomer utilized was also a Dow Corning material known as Dow Corning silicon 595. This material was L.I.M. molded to provide a 40 durometer on the Shore A Scale and was found to be sufficiently resilient for the use to be described.

Figure 1:
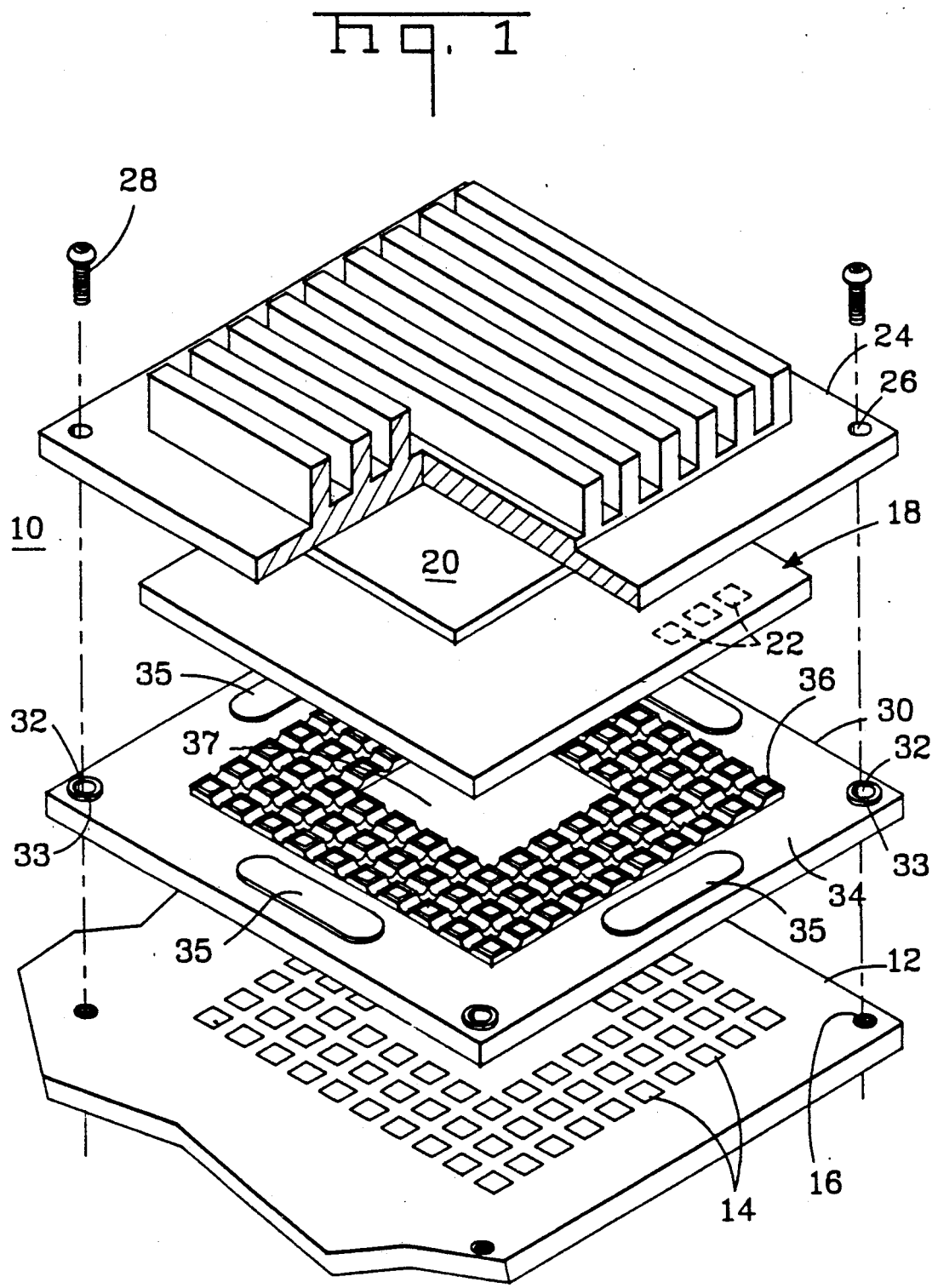
FIG. 1 is an exploded perspective, considerably enlarged, showing the invention connector in relation to a multi-layer printed circuit board, a chip carrier, and a heat sink.

Referring now to FIG. 1, an assembly 10 is shown to include a printed circuit board 12, representing a multi-layer printed circuit board typical of use in complex electronic circuits, a conductive, elastomeric grid array 30, a chip carrier 18 and a heat sink 24. These elements in use are fitted together and held together by virtue of fasting means passed through apertures on the edges of the elements and clamped by fasteners such as 28 shown in FIG. 1. The multi-layer board 12 includes a series of conductive pads 14 extending on the upper surface thereof in arrays on given centers and interconnected to conductive layers within the body of 12 to interconnect to further components to form useful functions. The chip carrier 18 shown in FIG. 1 includes in the center thereof a large scale integrated circuit mounted on a substrate such as a ceramic or plastic substrate 21 having an array of conductive pads on the bottom surface thereof, several such pads shown in phantom as 22 in FIG. 1. The various circuits within 20 are interconnected by traces not shown to the various pads 22. The heat sink 24 operates to conduct heat from the circuit chip 20 and dissipate such through fins on the upper surface thereof.

The pads 22 of the chip carrier 18 are on centers corresponding to the centers of pads 14 on the board 12 and are typically plated to provide an oxide-free surface. Between the chip carrier 18 and the board 12 is the grid array connector 30 formed of an elastomeric material. At the corners around the periphery of the body of the connector 30 are apertures 32 which correspond to apertures 16 of board 12 and 26 of the heat sink 24 and through which pass the fasteners 28 to lock the elements together and to board 12. The body of the connector, molded of elastomeric material, includes a series of rigid spacers such as 33 shown surrounding the apertures 32 and further spacers 35 embedded with the outer edges 34 of the connector. These spacers set precisely the spacing between the pads 22 of the chip carrier 18 and the pads 14 of board 12 by limiting the compression of the connector 30.

Figure 2:
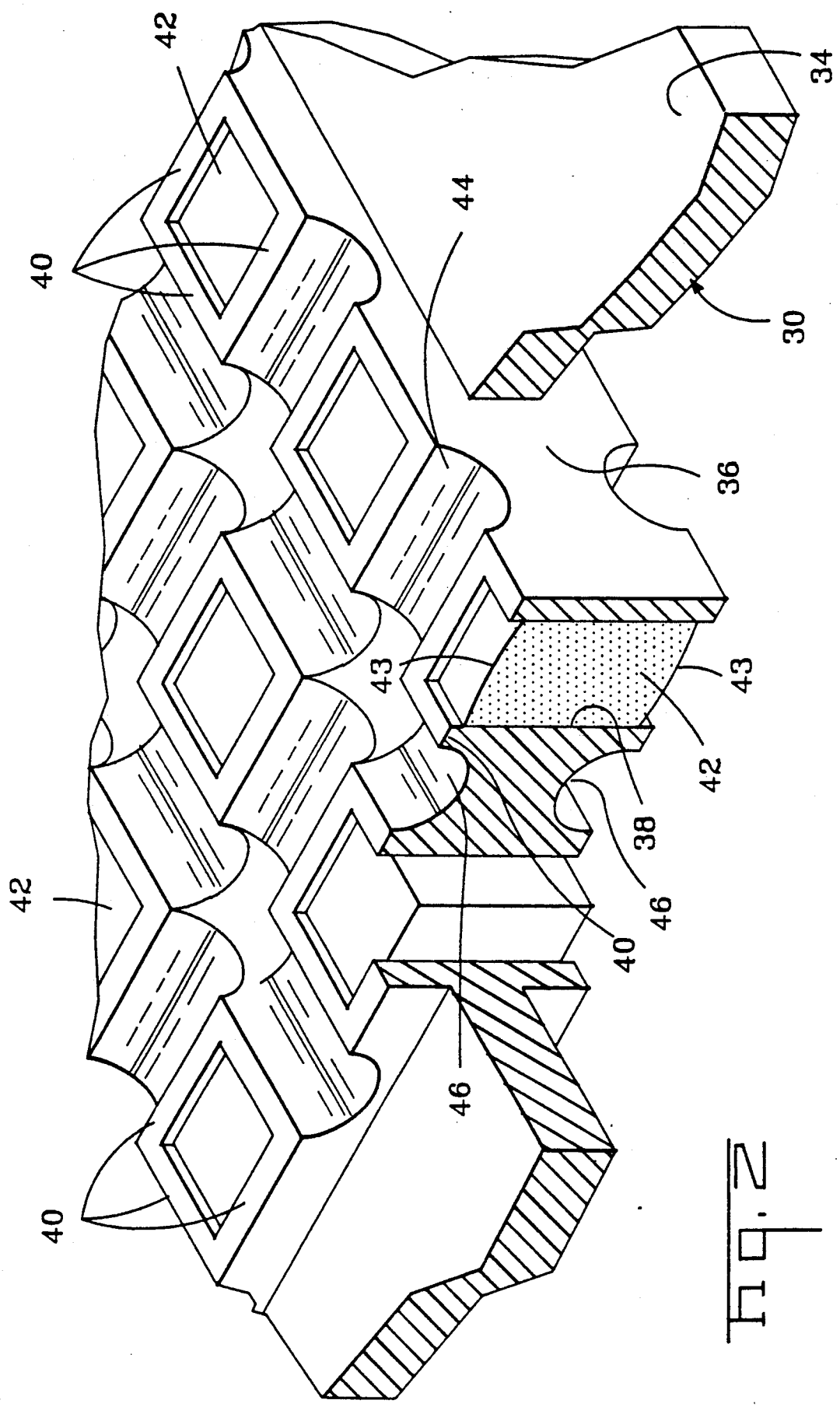
FIG. 2 is a perspective of a segment of the connector shown in FIG. 1, considerably enlarged therefrom.

As can be seen in FIG. 1 and in more detail in FIG. 2, the connector 30 includes a center region 37 which is cut away to receive the body of the integrated circuit 20 when the elements are clamped together. Center region 37 may be replaced with a thermally conductive medium; e.g. an elastomer having that property (Dow Corning Q 36605), to provide additional heat dissipation from a semi-conductive device to a thermally conductive substrate. Surrounding the cut away portion 37 are a series of projections 36 which extend in the manner shown in FIG. 2 above the surfaces of 34 and below such surfaces to define cavities 38. Each of the projections 36 include at the ends thin ribbed lips 40 surrounding the cavities. Within each cavity is disposed a conductive gel 42 which may include a slight meniscus 43 as better shown in FIG. 3 or may be flat. The projections of 36 to define lips 40 are further defined by a grid of channels which intersect, including channels 44 which run parallel across the connector 30 in one direction and the channels 46 which run transverse thereto, both as shown in FIG. 2. The lack of material defined by the channels 44 and 46 in conjunction with the dimensions of the cavities 38 and lips 40 provide a geometric body defining the force travel characteristic of the elastomeric material of the connector under pressure. The material itself, of course, provides another variable in terms of the force required to deform the material a given dimension. Put another way, a material with a given durometer such as for example, a durometer of 40 on the Shore A scale will give a given characteristic of force and deformation per unit volume. Alterations in the geometry or the unit volume will result in comparable alterations in the amount of force required to deform the particular body. Deformation of the elastomer accounts for most of the force of engagement, the gel itself very little.

The purpose of the assembly 10 is to interconnect the circuits within the integrated circuit 20 to the conductive paths of board 12 and thus to define various circuit functions.

Referring now to FIG. 3, the conductive pads 16 and 22 are shown aligned and positioned with the surfaces of chip carrier 20 and board 12 just touching the connector and prior to any deformation thereof. As can be seen in FIG. 3, the gel 42 rests within cavity 38 with its surfaces down within the cavity. As can be seen, the gel 42 has a meniscus 43 on each end, however, the surface may be flat if desired. In the condition shown in FIG. 3, the pads 16 and 22 are not interconnected and are isolated electrically. It is to be understood that in certain instances, particularly after use, the gel 42 may be displaced to one end or the other rather than as shown but will, in accordance with its characteristics in a relaxed condition, remain out of contact with one or the other of the pads 16 or 22 maintaining the open or disconnected condition.

FIG. 4 shows the elements of FIG. 3 in an activated or connected condition, driven relatively together by the fasteners 28 being screwed into the apertures 16 of the board 12. In practice, the screws are turned until the standoff elements 33 and 35 bottom out against the surfaces of the chip carrier 18 and the board 12. As mentioned, this limits the deformation that can occur to the connector 30. In FIG. 4, the material of the connector can be seen to be deformed top and bottom with the lips 40 deformed in a manner to seal the gel 42 within the cavity 38. The elastomeric nature of the material from which 30 is formed allows the body to further deform, driving the gel slightly axially outward, top and bottom, of the cavity to contact the pads 14 and 22 and effect an interconnection therebetween. Closure between the elements 12 and 20 is controlled to achieve a deformation resulting in broad area contact between the gel and the pads 14 and 22 to provide a stable low resistance interconnection. As can be discerned from FIG. 4, the invention contemplates an elastomer sufficiently resilient to bow slightly outward as at numeral 31 to relieve the criticality of tolerance with respect to the standoffs 33 and 35 by allowing the gel to expand within the cavity without being forced to pass the lip seals and thus spread on the surfaces of board 12 and the chip carrier. Deformation of the lips readily facilitates most of the displacement of the elastomer.

Upon release of the fasteners 28, the elements shown in FIG. 4 will return to the condition shown in FIG. 3, the gel withdrawing into the cavity to its original geometry and configuration. One of the characteristics of the gel is that it wets to the surface of the conductive pads sufficient to provide contact but it wets to the elastomer even moreso to stay with the cavity.

Referring now to FIG. 5, an embodiment of the invention is shown wherein the connector 30' is made of two halves laminated and bonded together as at 35. As will be discerned, the cavity 38 includes interior expanded diameters in the halves to form a relieved volume surrounding the cavity as at 31'. FIG. 6 shows the elements of FIG. 5 activated and the resulting expansion of the gel 42 into the added volume 31' which allows flow of the gel under the deforming forces of the connector body 30'. The volume also serves to help hold the gel 42 within cavity 38 by allowing expansion of the gel into the cavity 31' as indicated by FIG. 5.

FIG. 6 shows a further embodiment of the invention wherein the connector body 30', including the recessed cavity 31', is made to include a solid metal slug 37, preferably of copper and silver plated so that the upper and lower surfaces thereof are electrically connected to the gel 42 on the upper and lower surfaces. As can be seen in FIG. 7, the gel as divided again conforms to the cavity 48 with the meniscus 43 as before. Upon actuation of the fasteners, the connector 30' will deform as before so that the gel 42 contacts the contact pads 14 and 22. The electrical connection which results between the pads goes through the upper and lower portions of the gel and through the slug 37. The embodiment shown in FIGS. 7 and 8 is particularly useful wherein a lower resistance path is required than can be achieved than by the particular bulk resistance of the particular gel composition being employed. Connectors with extra long cavities which would require extra long paths of gel may very well utilize the embodiment shown in FIGS. 7 and 8. With respect to these embodiments, the slug 37 may, of course, have a greater length than is shown, and it is contemplated may have variations in the surfaces which are shown flat to increase the area of contact with the gel and/or increase the adhesion. The surfaces of the slug may also be roughened up, etched or pitted in a manner to increase wetability to the gel as well. It is contemplated that the cavities of 38 may also be treated as by coating with adhesion enhancing materials to provide a wetability to the gel which is at least greater than the wetability of the surfaces of the contact pads 14 and 22 which are typically plated with gold or some other alloy having low oxidation characteristics.

The invention contemplates a variety of shapes for the various cavities from rectangular to circular and so forth. The invention also contemplates a variety of shapes for the sealing lips 40.

The dimensions of the cavities and the volume of gel need to be adjusted to define an adequate resistance for the particular types of components being employed. A typical resistivity for a gel being employed is 1.2 times $10^{-3}$ ohm centimeters. The actual resistance of a given path can be calculated by dividing resistivity by the area of contact and multiplying the path length to yield resistance in ohms. In a working prototype of the invention, the connector body was formed of the previously mentioned Dow Corning material to a thickness on the order of 0.065 inches with the cavity 38 filled with gel to a degree to leave a space from the top of the gel to the top of the lips 40 on the order of 0.010 inches as measured from the edge oft he gel within cavity 38. The gel and the cavity 38 had a diameter of 0.025 inches and the meniscus, as measured from the edge to the top center thereof had a dimension on the order of 0.003 to 0.007 inches. A deformation of the connector body on the order of 0.020 inches resulted in the cavity 38 being compressed to essentially fill the volume thereof with gel, leaving a path length on the order of 0.045 inches. While some deformation of the cavity will occur as heretofore mentioned, the resistance of the gel path will be of on the order of 75 milliohms, and resistances ranging between 50 and 100 milliohms can readily be achieved by volume and area changes coupled with changes to the composition of the gel. Resistances of these orders of magnitude are quite adequate for the bulk of electronic devices being employed presently which utilize very low power, low current and low voltage signals.

Prototypes of the invention having the foregoing dimensions were fabricated to include 227 cavities on 0.050 inch centers arrayed in 3 rows around the periphery of a package having the outside dimensions of 1.140 by 1.180 inches. This package is typically provided in a ceramic body to define a land grid array.

While the invention has been detailed and described relative to interconnecting contact pads, the invention contemplates interconnecting circuit paths of different configurations which, in one condition, are not interconnected by a gel, and in another condition through the deformation of an elastomer, brought into an interconnected condition through the said gel.

Having now described the invention in terms intended to enable a practice thereof in preferred modes, claims are set forth intended to define what is inventive.

We claim:

1. An electrical connector adapted to electrically interconnect first and second circuit path surfaces including a connector body of dielectric material having elastomeric characteristics and containing a plurality of cavities extending therethrough, the body of said connector proximate said cavities having a geometry in conjunction with the elastomeric characteristics of the material to be readily deformable by pressure applied through said surfaces along a longitudinal axis of said cavity, a conductive gel positioned in the said cavity in a volume slightly less than the volume of said cavity when said connector body is in an undeformed condition whereby upon the application of said pressure and deformation of said body, the volume of said cavity is reduced to cause said gel to flow into area engagement with the said surfaces thereby interconnecting electrically said surfaces through said gel.

2. The connector of claim 1 wherein each said cavity includes an internal recess adapted to accommodate said gel and hold said gel within said cavity.

3. The connector of claim 1 wherein each said cavity includes an internal recess adapted to accommodate the flow of gel under pressure.

4. The connector of claim 1 wherein each said cavity includes a conductive material therewithin the said gel disposed on each side of said material whereby to reduce the path of resistance through said cavity.

5. The connector of claim 1 wherein said body includes a lip means surrounding each said cavity and operable to seal said gel within said cavity upon deformation of said body through application of said pressure from said first and second surfaces.

6. The connector of claim 1 wherein said body includes a thin deformable lip surrounding each said cavity at each end of said cavity to effectively seal said gel within said cavity upon deformation of said body through the application of pressure from said first and second surfaces.

7. The connector of claim 1 further includes means to compress said body by driving said surfaces relatively together.

8. The connector of claim 1 wherein the said first surface is a conductive pad on a printed circuit board and the said second surface is a conductive element on a component connected through said connector to said printed circuit board.

9. The connector of claim 1 wherein the said body includes a plurality of cavities arranged in an array compatible with the array of conductive pads in an integrated circuit device.

10. An electrical connector adapted to interconnect the conductive paths of an electronic component to a printed circuit board including a body containing a plurality of cavities arranged in an array compatible with the conductive paths of said component and printed circuit board with said body being formed of a thin elastomeric material which is readily deformable and with each said cavity being surrounding by a lip of material adapted to be deformed and to seal said cavity upon deformation between said component and said board, a conductive gel substantially filling each said cavity whereby upon deformation of said body and said lip the said gel is caused to flow into engagement with the contact paths of the said component and the said board to provide and interconnection therebetween.

11. The connector of claim 10 whereby the said interior surfaces of the said cavities are provided with characteristics having a wetability to said gel greater than the wetability of the pads of said component and board whereby to preclude sticking of said gel to the said pads and retain said gel within said cavities.

12. The connector of claim 10 wherein said cavities are deformable to accommodate compression of said gel during deformation of said body.

13. The connector of claim 10 further including a centrally located region for receiving a thermally conductive medium.

* * * * *